United States Patent [19]

Price

[11] 4,163,908
[45] Aug. 7, 1979

[54] BIAS CIRCUIT FOR COMPLEMENTARY TRANSISTORS

[75] Inventor: John J. Price, Mesa, Ariz.

[73] Assignee: Motorola, Inc., Schaumburg, Ill.

[21] Appl. No.: 826,623

[22] Filed: Aug. 22, 1977

[51] Int. Cl.$^2$ .......................... H03K 1/00; H03K 17/60
[52] U.S. Cl. ................................ 307/296 R; 307/255; 307/310
[58] Field of Search ............... 307/296, 310, 255, 270; 330/266, 267, 257

[56] References Cited

U.S. PATENT DOCUMENTS

| | | | |
|---|---|---|---|
| 3,660,773 | 5/1972 | Free | 330/257 |
| 3,740,657 | 6/1973 | Tharmaratnam | 330/267 |
| 3,809,929 | 5/1974 | Vittoz | 307/310 |
| 4,077,013 | 2/1978 | Morez et al. | 330/267 |

Primary Examiner—Stanley D. Miller, Jr.
Assistant Examiner—B. P. Davis
Attorney, Agent, or Firm—Maurice J. Jones, Jr.

[57] ABSTRACT

A monolithic amplifier circuit including a differential stage, a differential-to-single ended converter stage, a bias circuit and complementary push-pull output transistors is disclosed. The bias circuit is comprised of a current supply, two semiconductor bias devices and two current sinks. The junctions of the bias devices are connected in series across the junctions of the complementary output transistors to provide bias and to compensate for temperature and process variations in the output transistors. One of the bias devices and one of the current sinks are connected in one parallel path and the other bias device and the other current sink are connected in another parallel path through which most of the current from the current supply flows. This parallel connection enables utilization of minimum geometry bias devices in addition to facilitating precise and predictable control of the bias voltages and currents.

12 Claims, 1 Drawing Figure

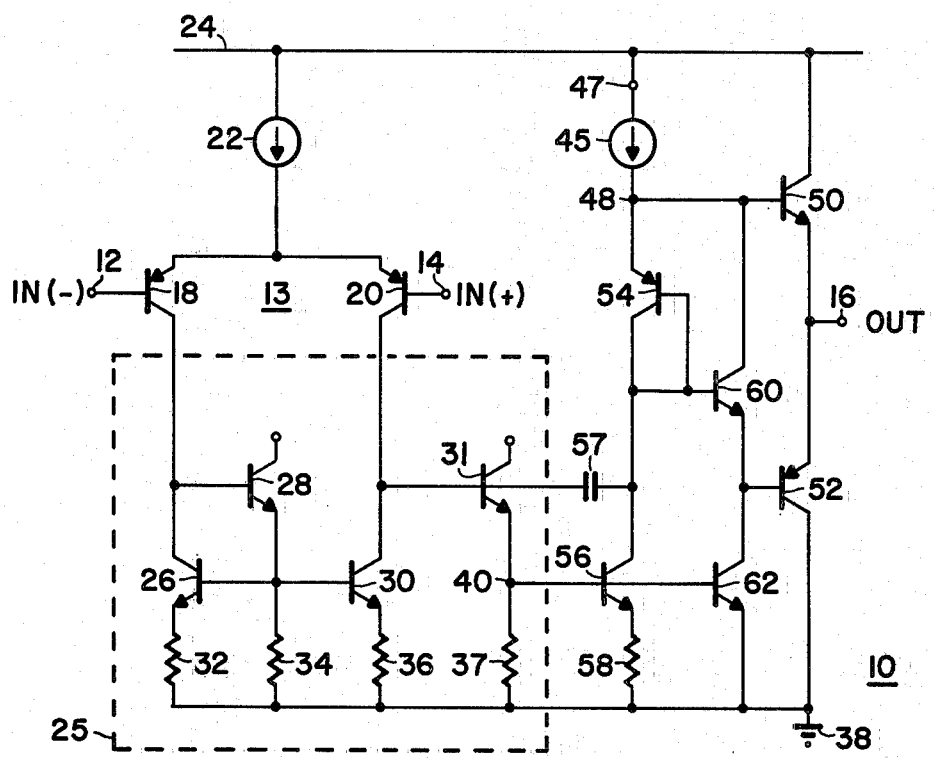

BIAS CIRCUIT FOR COMPLEMENTARY TRANSISTORS

BACKGROUND OF THE INVENTION

Modern electronic equipments often require circuits for biasing pairs of complementary output transistors. For instance, solid state, high power, audio frequency and operation amplifiers usually include pairs of complementary output power transistors for driving electrical loads and bias circuits, which generally are coupled between a supply of power and these complementary output transistors. Such bias circuits are required to provide quiescent or bias voltages and currents of known magnitudes to the complementary transistors for operating them Class AB to facilitate lowered power supply current drain as compared to Class A during quiescent operation and lowered crossover distortion as compared to Class B during dynamic operation. In some instances, it is desirable for such bias circuits to be manufactured in monolithic integrated circuit form to facilitate low cost, minimal space requirements and maximum reliability. In addition, it is often desirable for the Class AB bias circuits to provide compensation for the temperature induced voltage and current changes and process induced parameter variations in the complementary output transistors, which may be of either a monolithic or a discrete nature.

Prior art bias circuits have utilized NPN type monolithic devices for biasing and providing temperature and process compensation to the complementary NPN and PNP output transistors. Such NPN bias devices can successfully temperature compensate the complementary output NPN transistors even though the saturation current ($I_{es}$) of such output transistors typically can vary over a ten-to-one ratio because of process variations. Moreover, the changes in the NPN type biasing device compensates for similar changes in the structure and composition of the NPN complementary output transistor from wafer to wafer. Unfortunately, such changes in structure and composition of NPN bias devices do not compensate for process and temperature induced changes in the characteristics of PNP complementary output transistors.

Other prior art bias circuits utilize series connected NPN and PNP devices in an attempt to overcome the foregoing problem. In general, the base-to-emitter voltage of a junction varies inversely with the size of the junction and directly with the magnitude of the current through the junction. Thus, the larger the junction the smaller the base-to-emitter voltage produced for a given amount of current through the junction. Thus, monolithic devices having small junctions can produce a desired bias voltage in response to a small current for biasing the larger junction of a complementary output transistor operating at a quiescent current level of a greater magnitude than the current through the bias device. Since monolithic PNP complementary transistors are larger than NPN complementary transistors, the series connected PNP bias device must have a larger geometry than if the PNP biasing device didn't have to conduct the same current as the NPN bias device. Thus, bias networks including series connected NPN and PNP bias devices having the same current are undesirable because of the unnecessarily large amount of die area required for the PNP bias device. Thus, bias circuits including only NPN bias devices or series driven NPN and PNP bias devices are unsatisfactory for some applications. Moreover, such prior art circuits sometimes draw undesirably large currents and are difficult to design for providing precise and predictable current control.

SUMMARY OF THE INVENTION

An object of the invention is to provide an improved bias circuit configuration for complementary transistors.

Another object of the invention is to provide a bias circuit for complementary transistors which is suitable for being manufactured in monolithic integrated circuit form.

Still another object of the invention is to provide a circuit configuration for biasing complementary transistors which minimizes crossover distortion and provides compensation for temperature and process variations of the complementary transistors.

A further object of the invention is to provide a monolithic bias circuit for complementary transistors which takes up a minimal amount of die area, which facilitates precise and predictable control of the magnitude of the quiescent output current for the complementary transistors, and which requires only a small amount of current.

In brief, the bias circuit for complementary NPN and PNP output transistors includes a current supply, two semiconductor bias devices and two current sinks. The junctions of the bias devices are connected in series across the series connected base-to-emitter junctions of the NPN and PNP output transistors to provide temperature and process compensation. One of the bias devices and one of the current sinks are connected in series and form one parallel path for the current supply and the other bias device and the other current sink are connected in series and form another parallel path for the current supply. The output current of the current supply divides between these two parallel paths. The first and second current sinks control the amounts of current through the bias devices which facilitate utilization of minimum geometery bias circuitry and precise and predictable control of the bias signals.

BRIEF DESCRIPTION OF THE DRAWING

The sole FIGURE is a schematic diagram of a monolithic amplifier circuit including a bias circuit of the invention.

DETAILED DESCRIPTION OF THE PREFERRED EMBODIMENT

The FIGURE is a schematic of operational amplifier 10 which could be utilized as the integrator amplifier in a continuously variable delta modulation system, for instance. Circuit 10 is suitable for amplifying a differential input signal developed between input terminals 12 and 14 to provide an amplified, single-ended signal at output terminal 16. Differential amplifier 13 includes differential input transistors 18 and 20 having commonly connected emitter electrodes which are connected through current source 22 to positive power supply conductor 24.

Differential-to-single ended converted circuit 25 includes transistors 26, 28, 30 and 31 which are connected to the collector electrodes of input transistors 18 and 20. Resistors 32, 34, 36 and 37 connect the respective emitter electrodes of transistors 26, 28, 30 and 31 to negative power supply conductor 38. The collectors of transistors 28 and 31 are either coupled through additional supply transistors (not shown) or directly connected to conductor 24 in a known manner. Differential-to-single ended converter circuit 25 changes the differential signals between the collector electrodes of transistors 18 and 20 into a single-ended signal at output terminal 40 in a known manner. The electrical parameters of transistor 28 and resistor 34 are respectively matched to those of transistor 31 and resistor 37. Also, the electrical parameters of transistor 26 and resistor 32 are respectively matched to those of transistor 30 and resistor 36. This matching balances the electrical loads at the collectors of transistors 18 and 20 which allows the common mode rejection capability of differential amplifier 13 to effectively cancel out temperature and process induced differences in the parameters of differential-to-single ended converter circuit 25.

Current source or supply 45 includes an input terminal 47 connected to power supply conductor 24 and an output terminal 48. There are basically three parallel paths coupling output terminal 48 to the negative power supply conductor 38. One of these paths includes series connected complementary output NPN transistor 50 and complementary output PNP transistor 52. Since these complementary output transistors have relatively high betas, only a relatively small amount of current will be drawn during quiescent operation through the base-to-emitter junction of transistor 50 as compared to the amount of current through the other two paths.

Another, or second path, includes diode connected PNP lateral transistor 54 which has an emitter electrode connected to output terminal 48, and a base electrode connected to the collector electrode thereof. Also included in the second path is NPN current sink transistor 56, which includes a collector electrode connected to both the collector electrode of transistor 54, and through stabilizing capacitor 57, to the base electrode of transistor 31. Transistor 56 further includes a base electrode connected to the emitter electrode of transistor 31 and an emitter electrode connected through degenerative feedback resistor 58 to power supply conductor 38.

An additional or third parallel path includes NPN transistor 60 which has a collector electrode connected to output terminal 48, a base electrode connected to the the base and collector electrodes of transistor 54 and an emitter electrode connected both to the base electrode of complementary PNP output transistor 52 and to the collector electrode of NPN additional current sink transistor 62. The base electrodes of current sink transistors 56 and 62 are connected together and the emitter electrode of transistor 62 is connected to negative power supply conductor 38.

Complementary output transistors 50 and 52 have main or collector and emitter electrodes connected in series between power supply conductor 24 and power supply conductor 38. The collector electrode of transistor 50 is directly connected to power supply conductor 24 and the collector electrode of transistor 52 is directly connected to power supply conductor 38 to facilitate a dynamic output signal at the commonly connected emitters thereof having a maximum amplitude.

QUIESCENT OPERATION

If it is assumed that a potential difference is developed between conductors 24 and 38, then current source 22 and the current supplies connected to the collectors of transistors 28 and 31, respectively, bias differential amplifier 13 and differential-to-single ended converter 25 in a known manner. Transistor 31 conducts current for resistor 37 which develops a potential for biasing current sink transistors 56 and 62. Current from master current source 45 then flows mainly through the two parallel legs comprised of the leg including the emitter-to-collector path of PNP transistor 54 and the collector-to-emitter path of transistor 56 and through the leg including the collector-to-emitter path of transistor 60 and the collector-to-emitter path of transistor 62. Current sink transistors 56 and 62, respectively, control the magnitude of the currents through respective bias transistor 54 and 60 and thus the respective bias voltages for transistors 50 and 52. The emitter-to-base junctions of transistors 54 and 60 are connected in series across the base-to-emitter junctions of transistors 50 and 52 and develop a bias voltage for rendering complementary transistors 50 and 52 partially conductive so that they are biased Class AB. Lateral PNP transistor 54 provides compensation changes for undesired process and temperature induced variation in the electrical parameters of complementary PNP substrate output transistor 52 and NPN biasing transistor 60 provides compensation for undesired process and temperature induced variations in the electrical parameters of complementary NPN output transistor 50.

Generally, complementary output transistors 50 and 52 must be capable of providing about the same amount of maximum output current at about the same gain. Monolithic PNP substrate output transistors, such as transistor 52, generally must have greater junction areas than monolithic NPN output transistors, such as transistor 50, in order to provide the same amount of gain. Thus, the junction area of transistor 52 is required to be greater than a minimum size. The amount of bias voltage required by a semiconductor junction of a transistor to cause a selected amount of emitter-to-collector bias current varies inversely with the size of the junction. Accordingly, assuming that diode connected PNP transistor 54 and NPN transistor 60 have junctions of minimum sizes, it is desirable for transistor 60 to conduct more current than transistor 54. Thus, resistor 58 provides degenerative or negative feedback to transistor 56 so that transistor 56 sinks less current through PNP transistor 54 than transistor 62 sinks through NPN transistor 60. Since resistor 58 requires a low resistance of 3 Kilohms to 4 Kilohms, for instance, to perform the feedback function, resistor 58 also requires a minimal amount of die area. Thus, the configuration of the bias circuit including devices 45, 54, 56, 58, 60 and 62 enables the biasing devices, current sinking transistors and resistor to have minimal size and to conduct a minimum amount of current. The bias current facilitates temperature and process variation compensation to stabilize the quiescent currents of transistors 50 and 52 over a desired temperature range from wafer to wafer. The value of resistor 58 can be more easily adjusted to precisely and predictably determine the bias voltages provided by the bias devices than by adjusting the geometries of the bias and sink transistors, for instance.

DYNAMIC OPERATION

During dynamic operation, a differential input signal is applied between terminals 12 and 14 which is amplified by differential amplifier 13. Differential-to-single ended converter circuit 25 converts the amplified differential signals developed between the collectors of transistors 18 and 20 into a single-ended or unbalanced output signal at terminal 40. As the single-ended output signal swings positive, transistors 56 and 62 are rendered more conductive thereby causing their collector voltages to decrease, which causes transistor 52 to become more conductive and transistor 50 to become less conductive. This lowers the output voltage at terminal 16 toward the supply potential of conductor 38.

Alternatively, as the output voltage of the differential-to-single ended converter becomes more negative then transistors 56 and 62 are rendered less conductive thereby causing their collector voltages to increase in a positive direction which tends to render output transistor 52 less conductive and output transistor 50 more conductive so that the output voltage at terminal 16 tends to then swing towards the positive potential of conductor 24. As transistors 56 and 62 are rendered less conductive by the negative output voltage of the differential-to-single ended converter they sink less current, thereby forcing more of the current from master current source 45 to be applied to transistor 50. Alternatively, as transistors 56 and 62 are rendered more conductive then less base drive is provided for transistor 50. Thus, transistors 56, 60 and 62 are included in a driver circuit during dynamic operation.

What is claimed is:

1. A bias circuit for complementary NPN and PNP transistors, including in combination:
    a single current supply means for providing a current of a predetermined magnitude at an output terminal thereof;
    first semiconductor bias means having a junction coupled to said current supply means and one of the complementary transistors; second semiconductor bias means having a junction coupled to said current supply means and the other of the complementary transistors, said junctions of said first and second semiconductor bias means being connected in series with each other across the base-to-emitter junctions of the complementary NPN and PNP transistors;
    first current sink means coupled in series with said single current supply means and to said first semiconductor bias means for controlling the amount of bias current conducted by said first semiconductor bias means; and
    second current sink means coupled in series with said single current supply and said second semiconductor bias means for controlling the amount of bias current conducted by said second semiconductor bias means.

2. The bias circuit of claim 1 wherein:
    said first semiconductor bias means includes a transistor of a first conductivity type having an emitter electrode connected to an output terminal of said current supply means, a base electrode, and a collector electrode connected to said base electrode thereof at a common junction.

3. The bias circuit of claim 2 wherein:
    said first current sink means includes a transistor of a second conductivity type having a collector electrode connected to said common junction, a base electrode adapted to receive control signals and an emitter electrode; and
    first circuit means coupled to said emitter electrode of said transistor of the second conductivity type for providing negative feedback.

4. The bias circuit of claim 3 wherein said first circuit means includes a resistive means.

5. The bias circuit of claim 1 wherein said second semiconductor bias means includes a bias transistor of a second conductivity type having a collector electrode coupled to both said output terminal of said current supply means and to said base electrode of one of the complementary transistors, a base electrode coupled to said first semiconductor bias means and an emitter electrode coupled to both said base electrode of the other of the complementary transistors and to said second current sink.

6. The bias circuit of claim 5 wherein said second current sink includes a transistor of the second conductivity type having a collector electrode connected to said emitter electrode of said bias transistor of the second conductivity type, an emitter electrode adapted to be coupled to receive a negative power supply potential and a base electrode adapted to receive a control signal.

7. A bias circuit for complementary NPN and PNP transistors, including in combination:
    first and second power supply conductor means;
    current supply means for providing a current of a predetermined magnitude having an input terminal connected to said first power supply conductor means and an output terminal;
    PNP semiconductor bias means having a first terminal and a second terminal, said first terminal of said PNP semiconductor bias means being coupled to both said output terminal of said current supply means and to the base electrode of the complementary NPN transistor;
    first current sink means coupled between said second terminal of said PNP semiconductor bias means and said second power supply conductor means;
    NPN semiconductor bias means having a first terminal, a second terminal and a third terminal, said first terminal of said NPN semiconductor bias means being coupled to the base electrode of the complementary NPN transistor, said second terminal of the NPN semiconductor bias means being coupled to said second terminal of said PNP semiconductor bias means and said third terminal of said NPN semiconductor bias means being coupled to the base electrode of the complementary PNP transistor; and
    second current sink means having one terminal coupled to said third terminal of said NPN semiconductor bias means and said base electrode of the complementary PNP transistor and another terminal coupled to said second power supply conductor means.

8. The bias circuit of claim 7 wherein:
    said PNP semiconductor bias means includes a diode having a P region connected to said first terminal and an N region connected to said second terminal; and
    said NPN semiconductor means includes an NPN transistor having an N region connected to said first terminal, a P region connected to said second terminal, and an N region connected to said third terminal so that the PN junction of the PNP semiconductor bias means and the NP junction of the NPN semiconductor means are connected in series with each other across the base-to-emitter electrodes of the complementary NPN and PNP transistors for biasing the complementary NPN and PNP transistors to operate class AB and to compensate for temperature and process induced variations in the parameters of the complementary NPN and PNP transistors.

9. The bias circuit of claim 8 wherein:
said first current sink means includes a transistor having main electrodes coupled between said N region of said PNP semiconductor bias means and said second power supply conductor means; and
said second current sink means includes a further transistor having main electrodes connected between said third terminal of said NPN semiconductor bias means and said second power supply conductor means, said first and second current sink means enabling the current through said NPN and PNP semiconductor bias means to be individually and precisely adjusted.

10. A bias circuit for complementary NPN and PNP transistors, including in combination:
current supply means for providing a current of a predetermined magnitude at an output terminal thereof;
first semiconductor bias means coupled to said current supply means and one of the complementary transistors, said first semiconductor bias means including a transistor of a first conductivity type having an emitter electrode connected to an output terminal of said current supply means, a base electrode, and a collector electrode connected to said base electrode thereof at a common junction;
second semiconductor bias means coupled to said current supply means and the other of the complementary transistors;
first current sink means coupled to said first semiconductor bias means for controlling the amount of bias current conducted thereby, said first current sink means including a transistor of a second conductivity type having a collector electrode connected to said common junction, a base electrode adapted to receive control signals and an emitter electrode;
first circuit means coupled to said emitter electrode of said transistor of the second conductivity type for providing negative feedback; and
second current sink means coupled to said second semiconductor bias means for controlling the amount of bias current conducted thereby.

11. The bias current of claim 10 wherein said second semiconductor bias means includes a bias transistor of the second conductivity type having a collector electrode coupled to both said output terminal of said current supply means and to the base electrode of one of the complementary transistors, a base electrode coupled to said first semiconductor bias means and an emitter electrode coupled to both said base electrode of the other of the complementary transistors and to said second current sink.

12. The bias circuit of claim 11 wherein said second current sink includes a transistor of the second conductivity type having a collector electrode connected to said emitter electrode of said bias transistor of the second conductivity type, an emitter electrode adapted to be coupled to receive a negative power supply potential and a base electrode adapted to receive a control signal.

* * * * *